US012604584B2

(12) United States Patent
Miller et al.

(10) Patent No.:  US 12,604,584 B2
(45) Date of Patent:      Apr. 14, 2026

(54) LIQUID METAL ALLOYS IN A LIGHT-EMITTING DIODE DEVICE

(71) Applicant: CreeLED, Inc., Durham, NC (US)

(72) Inventors: Derek Miller, Columbus, OH (US); Ryan Zienert, Raleigh, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 782 days.

(21) Appl. No.: 17/943,556

(22) Filed: Sep. 13, 2022

(65) Prior Publication Data

US 2024/0088337 A1     Mar. 14, 2024

(51) Int. Cl.
| | |
|---|---|
| H10H 20/857 | (2025.01) |
| H01L 25/075 | (2006.01) |
| H10H 20/852 | (2025.01) |
| H10H 20/858 | (2025.01) |

(52) U.S. Cl.
CPC ...... H10H 20/857 (2025.01); H10H 20/8583 (2025.01); H01L 25/0753 (2013.01); H10H 20/852 (2025.01)

(58) Field of Classification Search
CPC ............ H10H 20/857; H10H 20/8583; H10H 20/852; H10H 29/8583; H10H 29/49; H10H 29/857; H10H 29/922; H10H 29/942; H01L 25/0753
See application file for complete search history.

(56) References Cited

U.S. PATENT DOCUMENTS

2020/0043880 A1*    2/2020   Mohammed ............ H01L 24/11
2020/0403133 A1*   12/2020   Yoo ..................... H01L 25/0753

FOREIGN PATENT DOCUMENTS

JP          2010272814  A   * 12/2010

OTHER PUBLICATIONS

JP-2010272814-A english translation.*

* cited by examiner

*Primary Examiner* — Latanya N Crawford Eason
(74) *Attorney, Agent, or Firm* — Withrow & Terranova, P.L.L.C.

(57)          ABSTRACT

The present disclosure relates to techniques for providing a liquid metal alloy in a light-emitting diode device that can both heal cracks formed in solder joints on the light-emitting diode (LED) device as well as improve thermal energy dissipation from the LED chips to improve the performance, reduce wear, and prolong the life of the LED chips. In an embodiment, a light-emitting diode device can include a liquid metal alloy containing gallium next to a solder joint, and when one or more cracks form, the liquid metal alloy can enter the cracks and solidify, healing the cracks. The liquid metal alloy can also be placed adjacent to, and in contact with the LED chip to transfer energy away from the LED chips.

19 Claims, 11 Drawing Sheets

LIQUID METAL ALLOYS IN A LIGHT-EMITTING DIODE DEVICE

FIELD OF THE DISCLOSURE

The present disclosure relates to light-emitting diode devices, and more particularly, to using a liquid metal alloy to heal LED solder joints and improve thermal dissipation on the light-emitting diode device.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LED chips and associated packaged devices are typically joined to printed circuit boards via one or more solder joints that are formed using a solder paste typically of Tin (Sn), Silver (Ag), Copper (CU) and some other trace metals such as antimony, bismuth, and nickel. Over time in operation at elevated temperature and thermal cycling, cracks form in the solder joint and the component will fail by losing electrical connection or by overheating.

Heat dissipation in LED devices and components primarily happens in directions toward LED component mounting surfaces, such as downward through an LED component substrate and corresponding electrical connections into a printed circuit board on which the LED component is mounted. In some instances, a heat sink may be arranged proximate to the printed circuit board to further aid in heat dissipation. Some heat is also radiated at the LED-air interface from the five exposed sides of the component, but unmoving air is not a good conductor of heat and this is inefficient.

As advancements in modern LED technology and high-powered electronics progress, the art continues to seek techniques to mitigate any cracks formed in the solder joint and to also improve thermal dissipation characteristics capable of overcoming challenges associated with conventional devices.

SUMMARY

The present disclosure relates to techniques for providing a liquid metal alloy in a light-emitting diode device that can heal cracks formed in solder joints on the light-emitting diode (LED) device and improve thermal energy dissipation from the LED chips to improve the performance, reduce wear, and prolong the life of the LED chips. In an embodiment, a light-emitting diode device can include a liquid metal alloy containing gallium next to a solder joint, and when one or more cracks form, the liquid metal alloy can enter the cracks and solidify, healing the cracks. The liquid metal alloy can also be placed adjacent to, and in contact with the LED chip to transfer energy away from the LED chips. This enables the LED chip to have thermal energy drawn away from four of the five sides of the LED more efficiently than air. The liquid metal alloy can be in a liquid state during LED operation and may be either liquid or solid at room temperature.

In an embodiment, a LED device can include a printed circuit board (PCB). The LED device can also include a light-emitting diode package attached to the PCB via a solder joint and a liquid metal alloy abutting the light-emitting diode package and the solder joint, wherein the liquid metal alloy is liquid at room temperature.

In another embodiment, a LED device can include a printed circuit board (PCB). The LED device can also include a light-emitting diode package attached to the PCB via a solder joint. The LED device can also include a liquid metal alloy abutting the light-emitting diode package, wherein the liquid metal alloy is liquid at room temperature.

In another embodiment, a LED device can include a printed circuit board (PCB). The LED device can also include a light-emitting diode package attached to the PCB via a solder joint. The LED device can also include a liquid metal alloy comprising gallium, wherein the liquid metal alloy is configured to fill a crack formed in the solder joint, and then subsequently solidify.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 7:
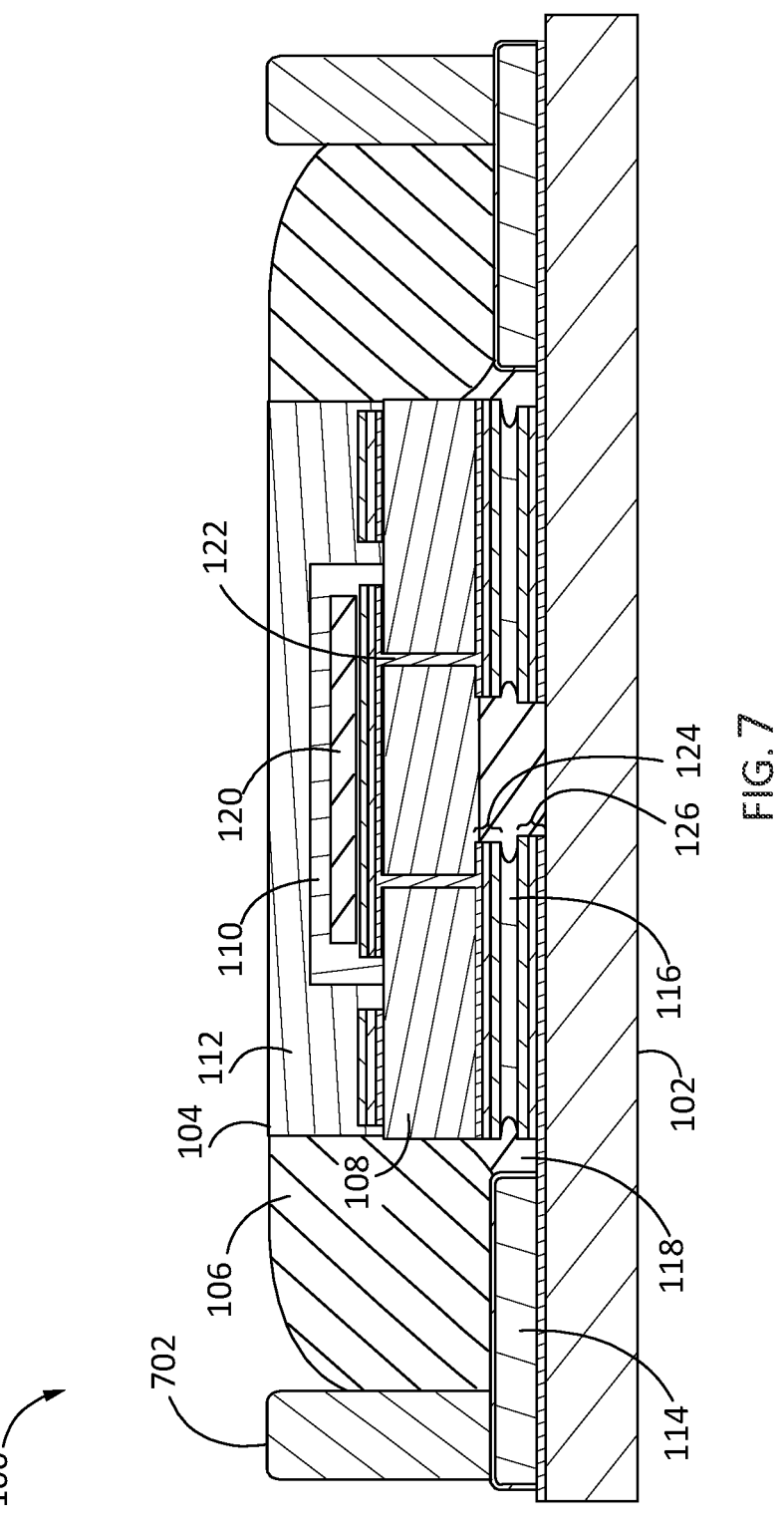
FIG. 7 illustrates another exemplary embodiment of a light-emitting diode device with a liquid metal alloy to facilitate thermal dissipation with additional heatsinks according to one or more aspects of the present disclosure.
Figure 8:
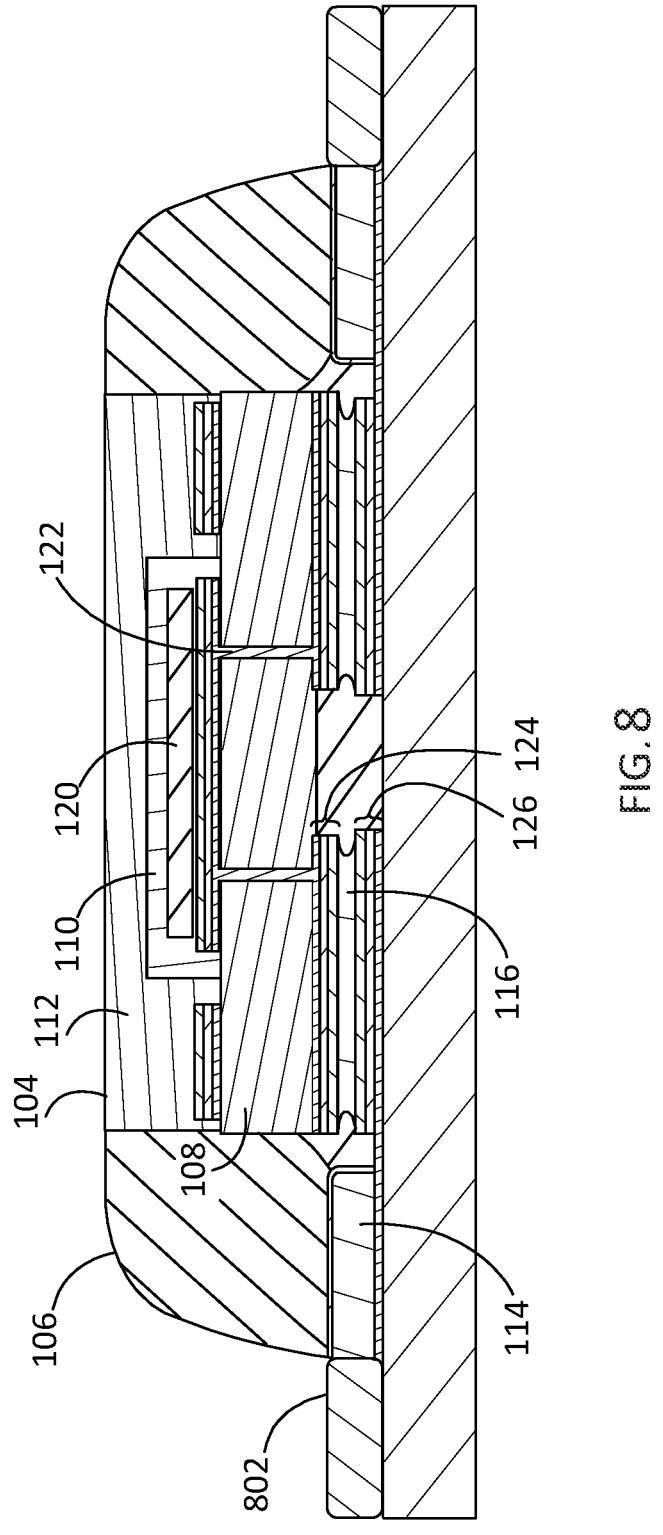
FIG. 8 illustrates another exemplary embodiment of a light-emitting diode device with a liquid metal alloy to facilitate thermal dissipation according to one or more aspects of the present disclosure.
Figure 9:
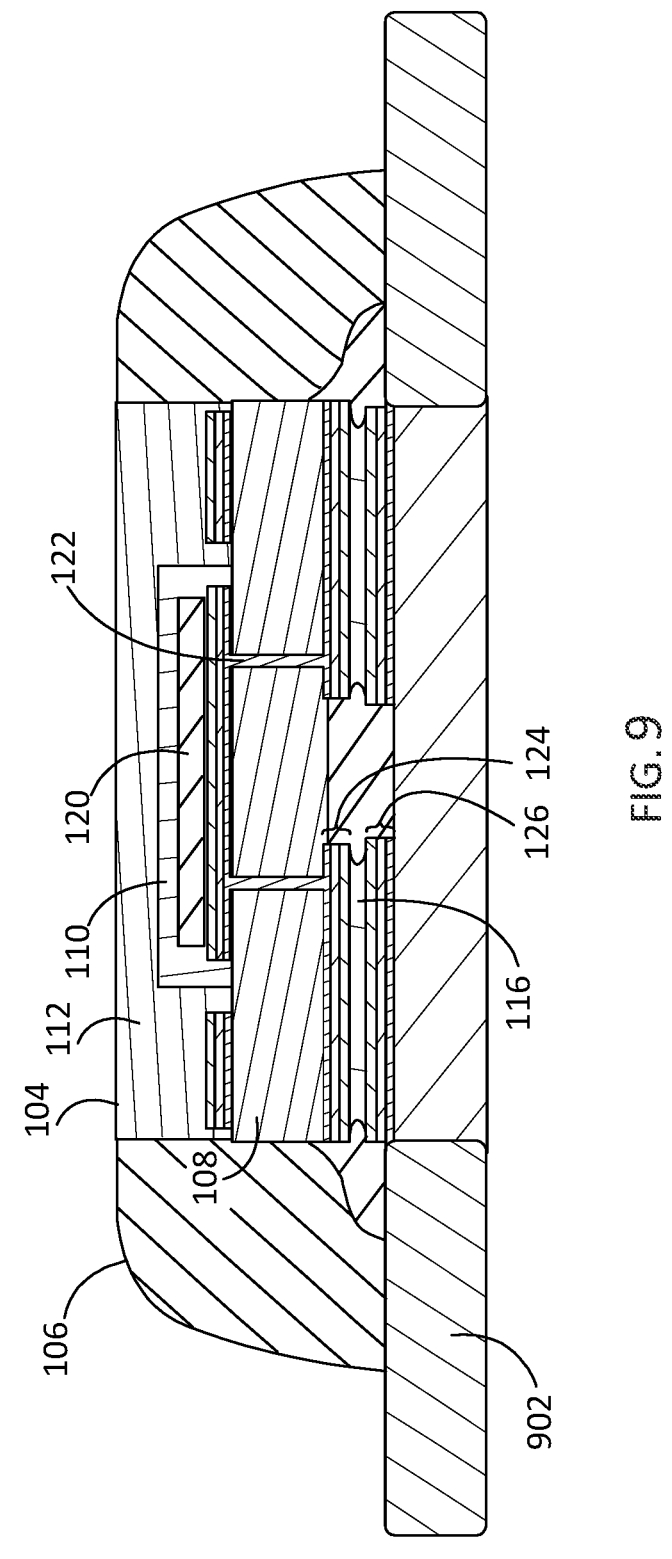
FIG. 9 illustrates another exemplary embodiment of a light-emitting diode device with a liquid metal alloy to facilitate thermal dissipation with additional heatsinks according to one or more aspects of the present disclosure.
Figures 11A, 11B, 11C:
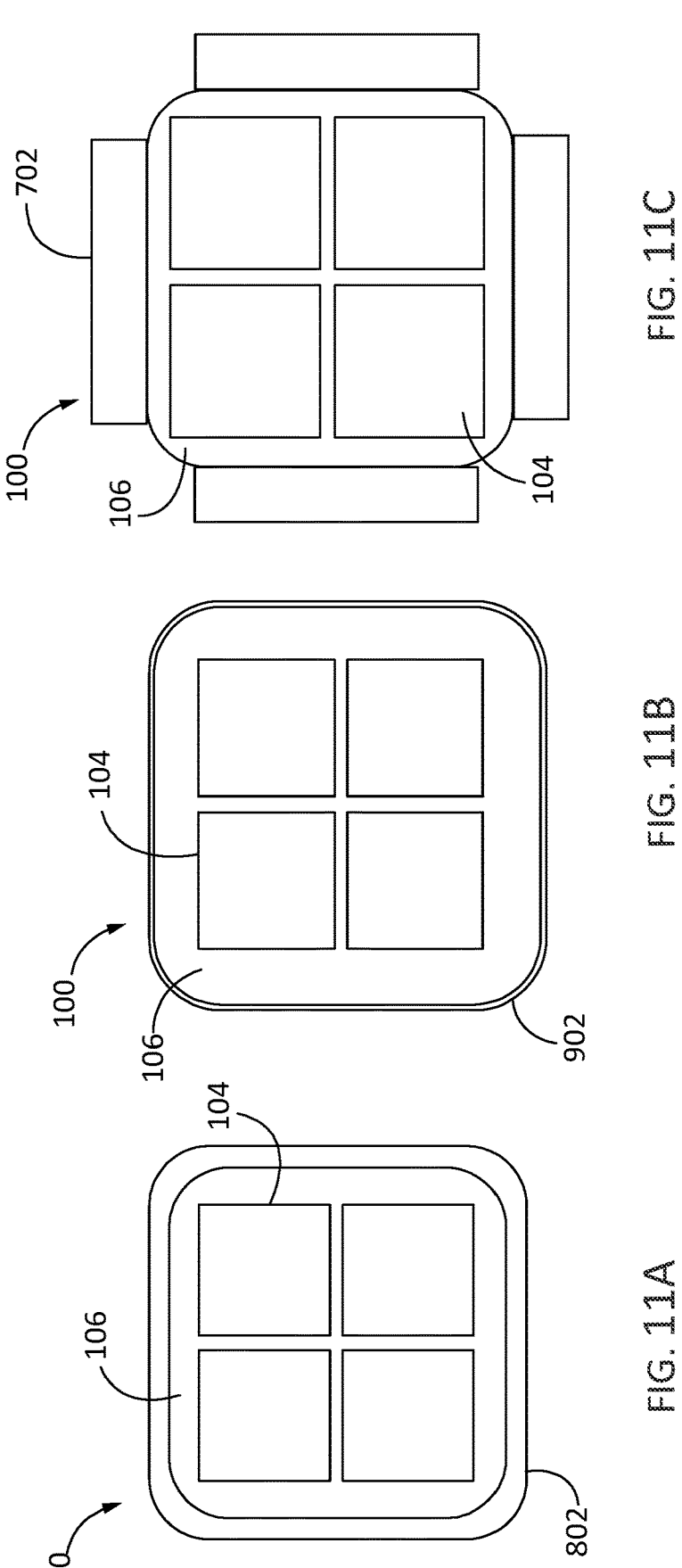

FIGS. 11A, 11B, and 11C illustrate top-down views of the embodiments depicted in FIGS. 8, 9, and 7 according to one or more aspects of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to techniques for providing a liquid metal alloy in a light-emitting diode device that can both heal cracks formed in solder joints on the light-emitting diode (LED) device as well as improve thermal energy dissipation from the LED chips in an LED package to improve the performance, reduce wear, and prolong the life of the LED chips. In an embodiment, a light-emitting diode device can include a liquid metal alloy containing gallium next to a solder joint, and when one or more cracks form, the liquid metal alloy can enter the cracks and solidify, healing the cracks. The liquid metal alloy can also be placed adjacent to, and in contact with the sides of the LED package to transfer energy away from the LED packages. This enables the LED package to have thermal energy drawn away from four of the five sides of the LED more efficiently than air. The liquid metal alloy can be in a liquid state during LED operation and may be either liquid or solid at room temperature.

An LED package typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super-lattice structures, un-doped layers, cladding layers, contact layers, and current-spreading layers and light extraction layers and elements. The active layer can comprise a single quantum well, a multiple quantum well, a double heterostructure, or super-lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In certain embodiments, the active LED structure may emit blue light with a peak wavelength range of approximately 430 nanometers (nm) to 480 nm. In other embodiments, the active LED structure may emit green light with a peak wavelength range of 500 nm to 570 nm. In other embodiments, the active LED structure may emit red light with a peak wavelength range of 600 nm to 650 nm. In certain embodiments, the active LED structure may emit light with a peak wavelength in any area of the visible spectrum, for example, peak wavelengths primarily in a range from 400 nm to 700 nm.

In certain embodiments, the active LED structure may be configured to emit light that is outside the visible spectrum, including one or more portions of the ultraviolet (UV) spectrum, the infrared (IR) or near-IR spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications. Near-IR and/or IR wavelengths for LED structures of the present disclosure may have wavelengths above 700 nm, such as in a range from 750 nm to 1100 nm, or more.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., $Ca_{1-x-y}Sr_xEu_y$-$AlSiN_3$) and combinations thereof. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers in on or over an LED chip.

Figure 1:
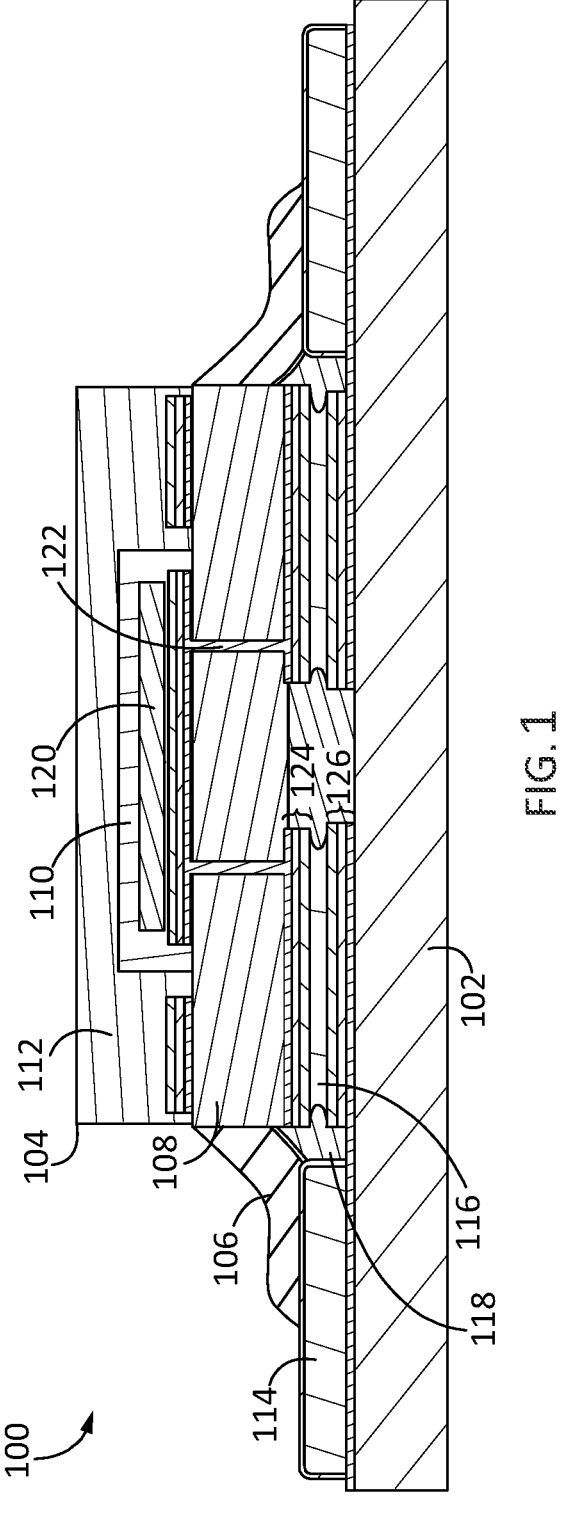
FIG. 1 illustrates an exemplary embodiment of a light-emitting diode device with a liquid metal alloy to facilitate thermal dissipation according to one or more aspects of the present disclosure.

FIG. 1 illustrates an exemplary embodiment of a light-emitting diode device 100 with a liquid metal alloy 106 to facilitate thermal dissipation according to one or more aspects of the present disclosure.

The light-emitting diode device 100 can include an LED package 104 that includes an LED chip 120 mounted on a ceramic substrate 108, a phosphor layer 110, an encapsulant (e.g., clear silicone lens) 112. The ceramic substrate can comprise one or more vias 122 that electrically couple the LED chip 120 to metal traces 124 on the bottom of the LED package 104. The solder joint 116 then bonds and electrically couples the metal traces 124 on the LED package 104 to metal traces 126 on the PCB 102. The metal traces 124 and/or 126 can be a single layer or can be a multiple layer metal stack.

In typical operation, thermal energy produced by the LED package 104 can pass through the ceramic substrate 108, and solder joint 116, to the PCB 102, which can further transfer the energy to an optional heatsink. However, heat can sometimes concentrate directly below the LED chip. In the present disclosure however, a liquid metal alloy 106 can be provided adjacent to the LED package 104 that can increase the surface area of the conductive surface, to transfer thermal energy away at a faster rate. In particular, the liquid metal alloy 106 may transfer heat laterally away from the LED chip 120 before coupling the heat with the PCB so that any hot spots directly underneath the LED chip 120 may be reduced. In an embodiment, assuming an LED package 104 is a quadrilateral, four exposed sides of the LED package 104 can be in contact with the liquid metal alloy 106, leaving just the top exposed.

In an embodiment, the liquid metal alloy 106 is in a liquid state during LED operation (50° C.-200° C.) and may either be liquid or solid at room temperature. The liquid metal alloy 106 has a much higher thermal conductivity (between 20-100 W/m-K) than air (~0.026 W/m-K) and can still allow natural convection within its liquid state. The liquid metal alloy 106 can make complete contact with the LED package 104 surface due to surface wicking properties. A normal solid metal heat sink generally uses an intermediate layer of thermal grease or paste (~1-10 W/m-K) to make contact and the lower thermal conductivity inhibits heat dissipation. The liquid metal alloy 106 may also act as a light reflector if allowed to surround the optical area of the LED, helping to direct light in a usable direction.

In an embodiment, the liquid metal alloy 106 can include one or more metals that are liquid at or just above room temperature, including gallium, mercury, caesium, or rubidium. Gallium can be alloyed to further reduce its melting point. A typical alloy could comprise approximately: 68 wt % Gallium, 22 wt % Indium, and 10 wt % Tin, which would have a melting point of −19° C. The alloy has a higher thermal conductivity (~70-80 W/m-K) than pure Gallium (29 W/m-K) due to higher thermal conductivity of Indium (82 W/m-K) and Tin (67 W/m-K). The liquid metal can also include rhodium, silver, and zinc for thermal, optical and corrosion property enhancement.

Liquid metal alloys are electrically conductive so the LED circuitry can be shielded or separated from it. In this case dielectric gel 118 can be used such as silicone, epoxy or ceramic-loaded composite which can in some embodiments prevent the liquid metal alloy 106 coming into contact with the solder joint 116. Additionally, a protective covering 114 can be placed to prevent the liquid metal alloy 106 from coming into contact with the PCB 102. In other embodiments, it may be desirable to have the liquid metal alloy 106 come into contact with the solder joint 116, and so the dielectric gel 118 can be deployed to separate portions of the liquid metal alloy 106 that are in contact with different LED chips 104 (in the case where there are multiple LED chips 104 on the PCB 102).

In an embodiment, the position of the liquid metal alloy 106 can be controlled by the surface tension properties of it and the materials surrounding it. The composition can be engineered so it only turns liquid during operation and is solid for shipping, handling and installation.

In the embodiment shown in FIG. 1, the liquid metal alloy 106 can be in contact with the ceramic substrate 108 of the LED package 104 and conduct heat away from the substrate 108 to facilitate cooling of the LED package 104.

Figure 2:
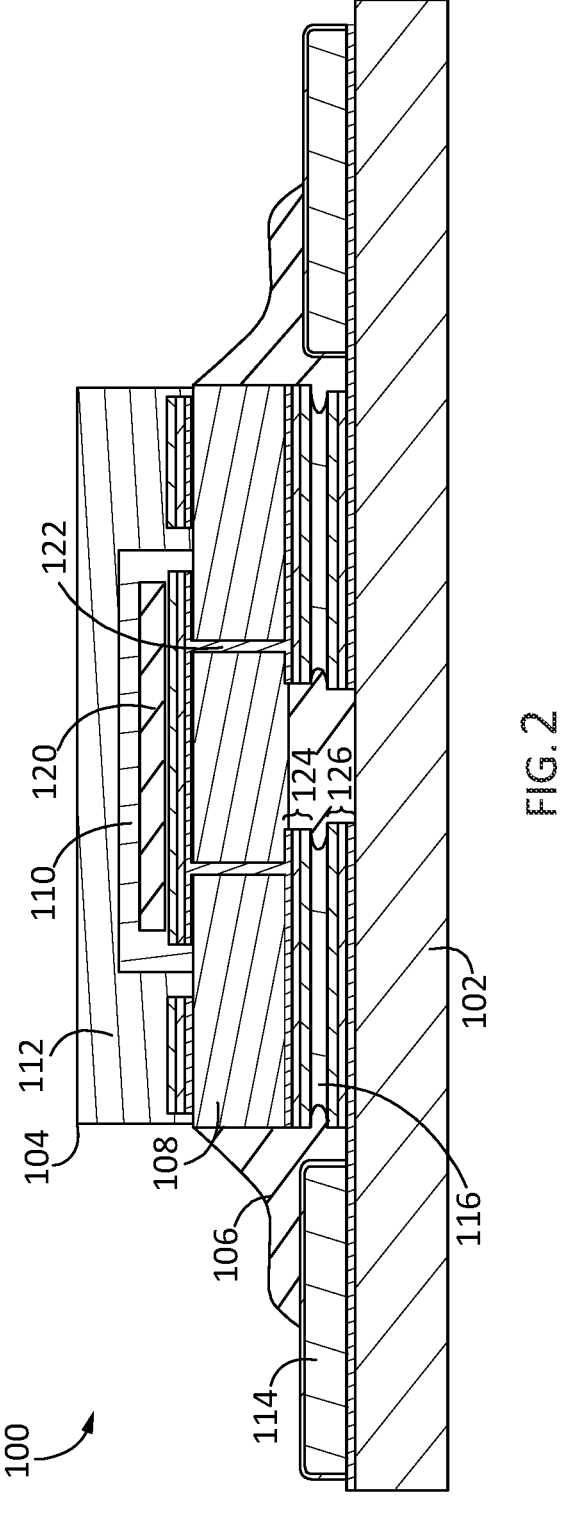
FIG. 2 illustrates an exemplary embodiment of a light-emitting diode device with a liquid metal alloy to facilitate thermal dissipation and heal solder joint cracks according to one or more aspects of the present disclosure.

Turning now to FIG. 2, illustrated is an exemplary embodiment of a light-emitting diode device 100 with a liquid metal alloy to facilitate thermal dissipation and heal solder joint cracks according to one or more aspects of the present disclosure.

The liquid metal alloy 106 can flow, seep, or otherwise enter into the solder joint cracks that form in the solder joint 116. In an embodiment, the liquid metal alloy 106 can remain in a liquid state during the operation of the LED device 100. In other embodiments, gallium in the liquid metal alloy 106 can interdiffuse into the material of the solder joint 116, thus raising the melting point of the liquid metal alloy 106 sufficiently so that the liquid metal alloy 106 solidifies at an operating temperature of the LED device 100.

When the liquid metal alloy 106 enters the cracks, this improves the electrical conductivity and mechanical stability of the solder joint, thus prolonging the life of the component, and reducing current crowding through the contacts that could otherwise lead to overheating. In an embodiment, the liquid metal alloy 106 can both be used to conduct heat away from the LED package 104 as well as be ready to fill any cracks that occur in the solder joint 116 during the operations of the LED device 100. In other embodiments, the liquid metal alloy 106 can be applied locally at regular intervals as preventative or curative maintenance.

Using a liquid metal alloy that contains gallium that solidifies after the melting temperature is increased due to the gallium interdiffusion is an improvement over a current technique to fix solder joint cracks where a metal alloy is melted once to form an electrical contact. Using this technique, when cracks form, the only way to heal them is to raise the temperature well above the solder's eutectic temperature (>250C in lead-free solder). This temperature can damage the electronic components. The present disclosure provides a techniques that when implemented, can heal cracks at room temperature in some alloys, and at <50C in other alloys. No special equipment is needed to use this with in-service maintenance.

In an embodiment, the liquid metal alloy 106 can be a eutectic Ga—In (EGaIn, 75.5 wt % Ga and 24.5 wt % In) has a melting point 15.5° C. Other commercial eutectic Ga—In—Sn alloys can be used that are 68.5 wt % Ga, 21.5% wt % In, and 10.0 wt % Sn) which has a melting point of −19° C. The liquid metal alloy 106 can also include rhodium, silver, antimony, bismuth, nickel, and zinc for thermal, optical and corrosion property enhancement.

In an embodiment the liquid metal alloy 106 could also be used to heal cracks or failures in diode attachments, or wire bond interfaces. In another embodiment, the liquid metal alloy 106 could be used as a temperature or gravity-based interlock in the circuit, where the presence or absence of the liquid metal alloy 106 in the circuit allows current to flow when a certain temperature is achieved or when the physical orientation of the circuit is upward/downward.

Figure 3:
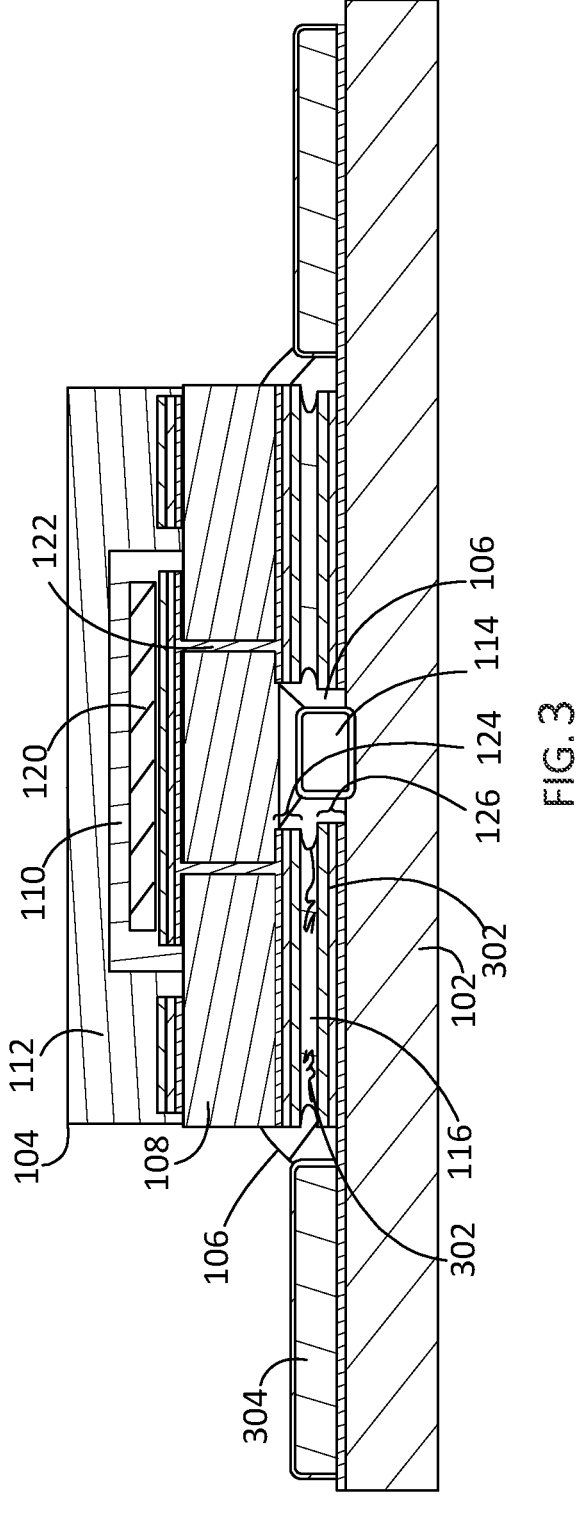
FIG. 3 illustrates an exemplary embodiment of a light-emitting diode device with a liquid metal alloy to heal solder joint cracks according to one or more aspects of the present disclosure.

FIG. 3 illustrates another exemplary embodiment of a light-emitting diode device 100 with a liquid metal alloy 106 to heal solder joint cracks according to one or more aspects of the present disclosure.

In FIG. 3, the liquid metal alloy 106 is just applied to an area in between the solder mask 304 and the metal traces 124 and 126 and solder joint 116, on either side of the solder joint 116, where it can be used to cure cracks 302 that form in the solder joint 116 over time. The liquid metal alloy 106 can be applied during manufacture of the LED device 100 or at a later time during maintenance of the LED device 100. If applied ahead of time, the liquid metal alloy 106 can be held in place or adhere to the well or reservoir between the PCB 102, the solder mask 304, and the solder joint 116 via surface adhesion.

Figures 4A, 4B:
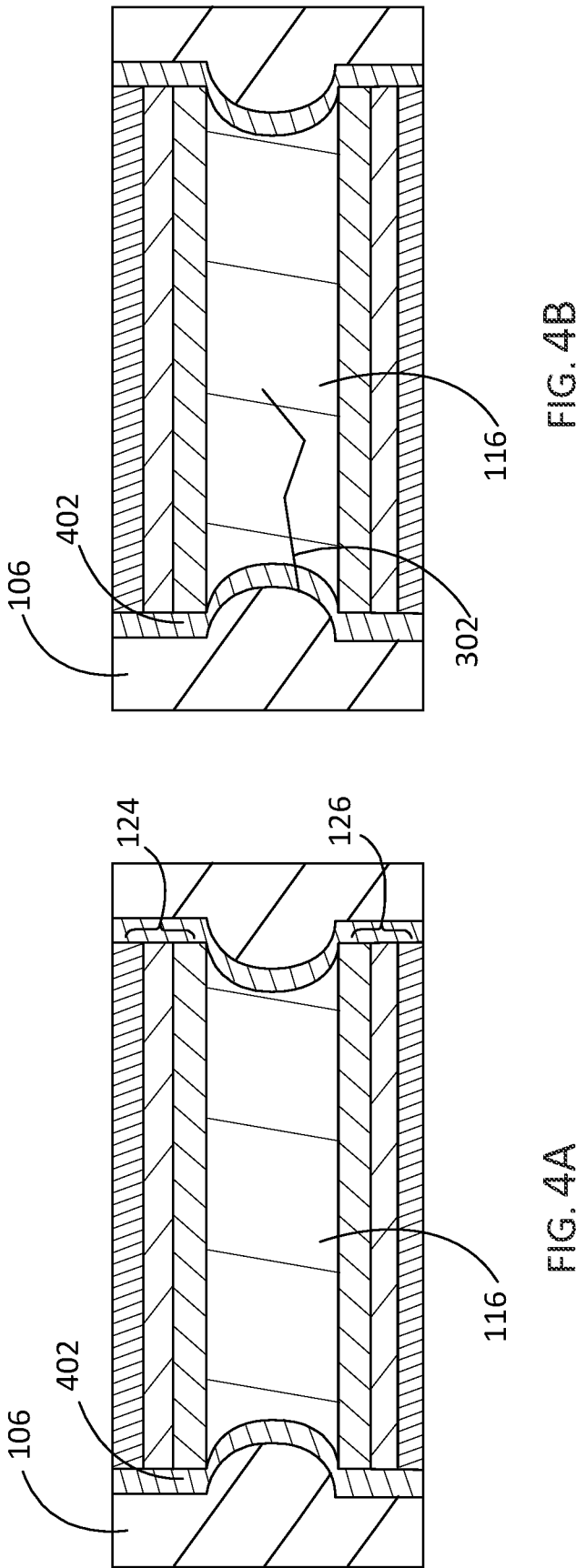
FIGS. 4A and 4B illustrate another exemplary embodiment of a technique for a liquid metal alloy to heal solder joint cracks according to one or more aspects of the present disclosure.

FIGS. 4A and 4B illustrate an exemplary embodiment of a technique for a liquid metal alloy to heal solder joint cracks according to one or more aspects of the present disclosure.

The technique depicted in FIGS. 4A and 4B can ensure that the liquid metal alloy 106 does not interact metallurgically or chemically with the material of the solder joint 116 until a crack actually forms. In this way, the liquid metal alloy 106 can be applied at manufacture, and no interdiffusion of the gallium occurs until there is actually a crack 302 present in the solder joint 116. A ceramic or polymer coating 402 can be applied to the sides of the solder joint 116 that acts as a barrier between the liquid metal alloy 106 and the material of the solder joint 116. In an embodiment, the ceramic or polymer coating 402 can be at least one of: SiO2, Al2O3, TiO2, other ceramics, or high-temp polymers like polyimide/polyamide or silicones. When cracks form in operation, as shown in FIG. 4B, the ceramic or polymer coating 402 also cracks, allowing the liquid metal to flow into the cracked area of the solder joint.

In an embodiment, the ceramic or polymer coating 402 can be proactively or manually cracked on a scheduled basis, such as for preventative maintenance. The liquid metal alloy reservoir could be located adjacent to the solder joint 116 and be activated remotely at a scheduled lifetime by using any of the methods below, allowing it to then flow around the solder joint and heal the cracks. The following techniques or methods could be used to break down the barrier (e.g., the ceramic or polymer coating 402): Resistive heating (via a separate circuit); electromagnetic agitation; acoustic agitation; electronic induction; and/or targeted near-infrared heating.

Figures 5A, 5B:
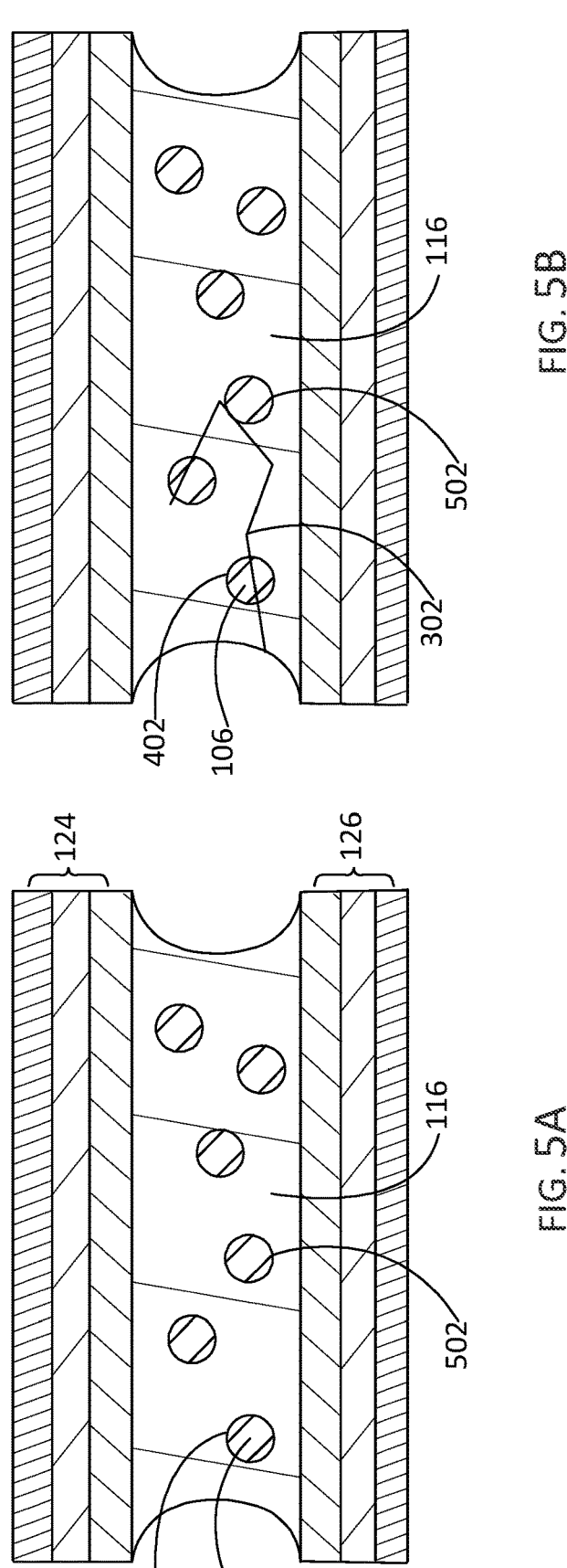
FIGS. 5A and 5B illustrate another exemplary embodiment of a technique for a liquid metal alloy to heal solder joint cracks according to one or more aspects of the present disclosure.

A different approach is depicted in FIGS. 5A and 5B. Instead of the ceramic or polymer coating 402 being a barrier between the liquid metal alloy 106 and the solder joint 116 on the side of the solder joint 116, the liquid metal alloy 106 can be encapsulated in small beads or capsules 502 within the solder joint 116, with the ceramic or polymer coating 402 encapsulating the liquid metal alloy 106. When a crack 302 occurs in the solder joint, as shown in FIG. 5B, the crack 302 will likely pierce at least one of the capsules 502, and the ceramic or polymer coating 402, thus allowing the liquid metal alloy 106 to flow or otherwise enter into the crack 302, curing the crack.

Figure 6:
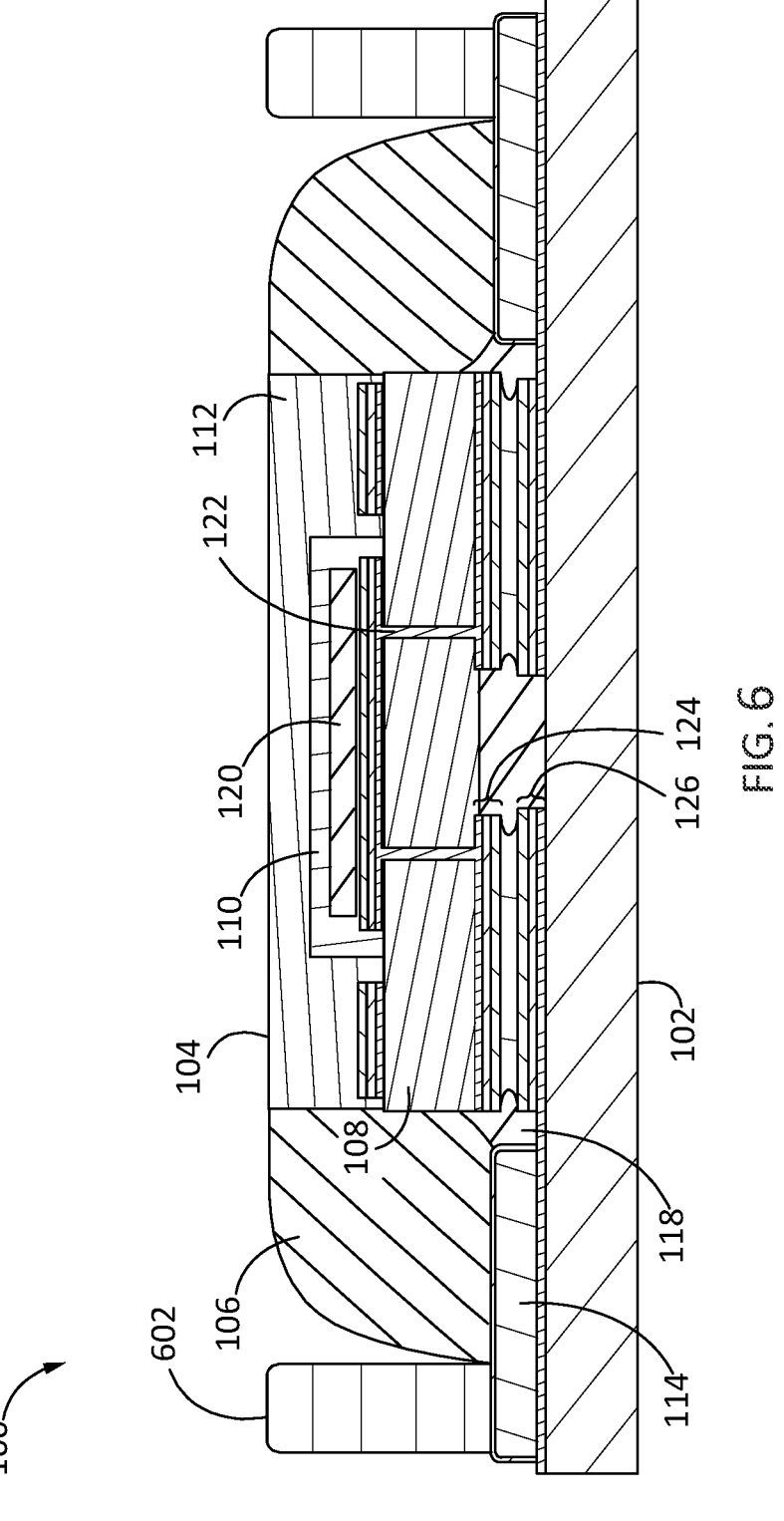
FIG. 6 illustrates another exemplary embodiment of a light-emitting diode device with a liquid metal alloy to facilitate thermal dissipation according to one or more aspects of the present disclosure.

FIG. 6 illustrates another exemplary embodiment of a light-emitting diode device 100 with a liquid metal alloy 106 to facilitate thermal dissipation according to one or more aspects of the present disclosure.

In the embodiment shown in FIG. 6, the liquid metal alloy 106 can be placed in a gap between a dam 602 and the LED package 104. The liquid metal alloy 106 can cover the side wall of the entire LED package 104, including the side walls of the encapsulant 112 and the ceramic substrate 108. The liquid metal alloy 106 can thus more efficiently transfer heat away from the LED package 104 by increasing the surface area in contact with the LED package 104. In addition to added surface area for heat transfer, covering the sidewalls of the encapsulant 112 can also modify an emission pattern for the LED package 104, such as providing a more narrow emission pattern.

In an embodiment, the dam 602 can be a material that repels the liquid metal alloy 106 or displays "anti-wetting" characteristics where the liquid metal alloy 106 does not easily bond to, or contact the surface of the dam 602. In various embodiments, the dam can be formed of one or more of Teflon, quartz, graphite, etc. By contrast, the protective covering 114 can be of a material that displays "wetting" characteristics such that the liquid metal alloy 106 easily contacts and sticks to the surface of the protective covering 114.

FIG. 7 illustrates another exemplary embodiment of a light-emitting diode device 100 with a liquid metal alloy 106 to facilitate thermal dissipation with additional heatsinks according to one or more aspects of the present disclosure.

In FIG. 7, instead of a dam 602, there can be an adjacent heatsink 702 that can consist of a material such that the liquid metal alloy 106 readily adheres. The liquid metal alloy 106 can cover the side wall of the entire LED package 104, including the side walls of the encapsulant 112 and the ceramic substrate 108. The liquid metal alloy 106 can thus more efficiently transfer heat away from the LED package 104 by increasing the surface area in contact with the LED package 104. In addition to added surface area for heat transfer, covering the sidewalls of the encapsulant 112 can also modify an emission pattern for the LED package 104, such as providing a more narrow emission pattern. In an embodiment, an amount of sidewall coverage may be tailored based on a desired emission pattern for the LED package 104.

In this embodiment, the liquid metal alloy 106 can transfer thermal energy from the LED package 104 to the heatsink 702 which can radiate the thermal energy away from the LED device 100.

FIG. 8 depicts another exemplary embodiment of a light-emitting diode device 100 with a liquid metal alloy 106 to facilitate thermal dissipation according to one or more aspects of the present disclosure. In the embodiment shown in FIG. 8, there can be a substrate portion 802 that is different than the protective covering 114 in that the material or a pattern on the material repels the liquid metal alloy 106. The repellant characteristic of the substrate portion 802 can ensure that the liquid metal alloy 106 does not spread away from the LED package 104 and instead stay in contact with the LED package 104 to facilitate the transfer of thermal energy from the LED package 104 to the liquid metal alloy 106. In an embodiment, the substrate portion 802 can be a solder mask.

FIG. 9 depicts another exemplary embodiment of a light-emitting diode device 100 with a liquid metal alloy 106 to facilitate thermal dissipation with additional heatsinks according to one or more aspects of the present disclosure. In FIG. 9, instead of the heatsink 702 being located laterally adjacent to the liquid metal alloy 106, and above the PCB 102, the heatsink 902 can be integrated into, or underneath the PCB 102 and radiate the thermal energy below the LED device 100. In an embodiment, the liquid metal alloy 106 can radiate heat laterally away from the LED package 104 before directing it below the LED package 104 to the heatsink 902, thereby avoiding heat that could otherwise concentrate directly below the LED package 104. The liquid metal alloy 106 can remain in place due to the adhesion between the LED package 104 and the heatsink 902.

Figure 10:
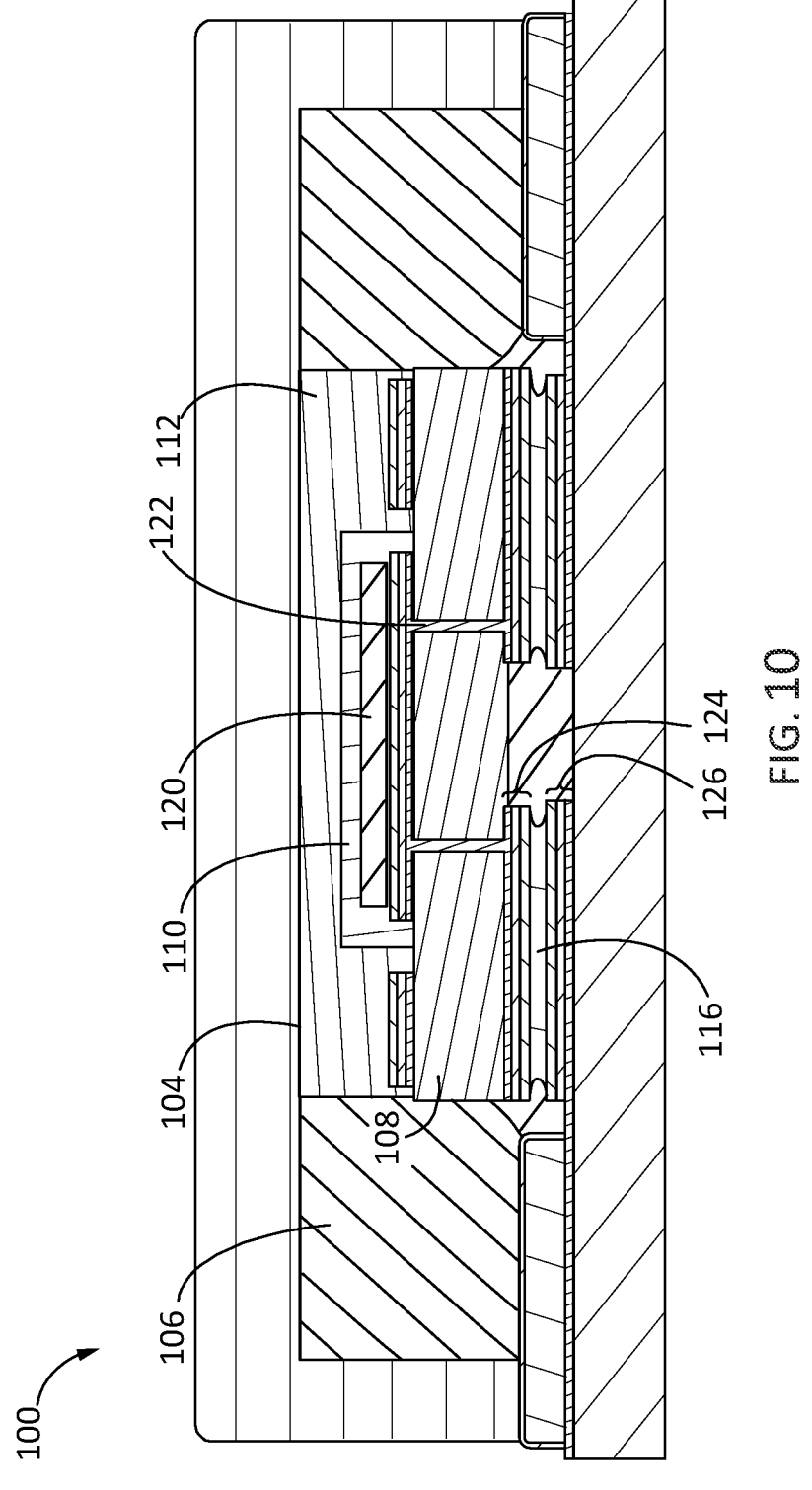
FIG. 10 illustrates another exemplary embodiment of a light-emitting diode device with a liquid metal alloy to facilitate thermal dissipation with a transparent encapsulation according to one or more aspects of the present disclosure.

FIG. 10 depicts an embodiment where a glass cover 1002 (or other suitable transparent or semitransparent covering encapsulates the LED package 104 and the liquid metal alloy 106. The liquid metal alloy 106 can thus be sealed within the glass cover 1002. In an embodiment, although not depicted here, the glass cover 1002 can also be used in the embodiments where there are heatsinks 702 or 902 in contact with the liquid metal alloy 106 to facilitate additional thermal energy dissipation from the LED device 100.

FIGS. 11A, 11B, and 11C illustrate top-down views of the embodiments depicted in FIGS. 8, 9, and 7, respectively, according to one or more aspects of the present disclosure.

In FIG. 11A, the LED device 100 is depicted as having 4 LED packages 104 mounted thereon, and the liquid metal alloy 106 can surround each of the 4 LED packages 104, and be held in place or prevented from spreading over the LED device 100 by the substrate portion 802 that repels the liquid metal alloy 106. The liquid metal alloy 106 can also stick to the LED device 100 and the LED packages 104 via surface tension. As the liquid metal alloy 106 is in contact with each of the LED packages 104, the dielectric gel 118 (shown in FIG. 1) can prevent the liquid metal alloy 106 from being electrically connected to any of the LED chips 104.

In FIG. 11B, the heatsink 902 is beneath the liquid metal alloy 106, whereas in FIG. 11C, the heatsink 702 is shown adjacent to, and sticking out from the LED device 100.

It is to be appreciated that while the embodiments in FIGS. 11A, 11B, and 11C show a 2×2 array of LED packages 104 on the LED device 100, any number and configuration of LED packages is possible in other embodiments, including LED devices with 1 LED package are LED devices with many more LED packages.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode device, comprising:
a printed circuit board (PCB);
a light-emitting diode package attached to the PCB via a solder joint; and
a liquid metal alloy abutting the light-emitting diode package and the solder joint, wherein the liquid metal alloy is liquid at room temperature.

2. The light-emitting diode device of claim 1, wherein the liquid metal alloy comprises gallium.

3. The light-emitting diode device of claim 2, wherein the liquid metal alloy is configured to fill a crack formed in the solder joint, and the gallium in the liquid metal alloy diffuses into a material of the solder joint, resulting in an increased melting point of the liquid metal alloy.

4. The light-emitting diode device of claim 3, wherein in response to the increased melting point of the liquid metal alloy, the liquid metal alloy solidifies at room temperature.

5. The light-emitting diode device of claim 1, further comprising:
a heatsink abutting the liquid metal alloy, wherein the heatsink dissipates thermal energy from the light-emitting diode package received via the liquid metal alloy.

6. The light-emitting diode device of claim 5, wherein the heatsink is above the PCB, and lateral to the light-emitting diode package.

7. The light-emitting diode device of claim 5, wherein the heatsink is integrated into the PCB.

8. The light-emitting diode device of claim 1, further comprising:
a substrate material on a surface of the PCB that surrounds the liquid metal alloy, wherein the substrate material has an anti-wetting surface that repels the liquid metal alloy.

9. The light-emitting diode device of claim 1, further comprising:
a solder mask layer in between the liquid metal alloy and the PCB.

10. The light-emitting diode device of claim 9, further comprising:
a transparent encapsulating layer that encapsulates the solder mask, the liquid metal alloy and the light-emitting diode package.

11. A light-emitting diode device, comprising:
a printed circuit board (PCB);
a light-emitting diode package attached to the PCB via a solder joint; and
a liquid metal alloy abutting the light-emitting diode package, wherein the liquid metal alloy is liquid at room temperature.

12. The light-emitting diode device of claim 11, further comprising:
a heatsink abutting the liquid metal alloy, wherein the heatsink dissipates thermal energy from the light-emitting diode package received via the liquid metal alloy.

13. The light-emitting diode device of claim 11, further comprising a dielectric barrier that separates the liquid metal alloy from the solder joint.

14. The light-emitting diode device of claim 11, further comprising:
a transparent encapsulating layer that encapsulates the liquid metal alloy and light-emitting diode package.

15. The light-emitting diode device of claim 11, further comprising:
a substrate material on a surface of the PCB that surrounds the liquid metal alloy, wherein the substrate material has an anti-wetting surface that repels the liquid metal alloy.

16. A light-emitting diode device, comprising:
a printed circuit board (PCB);
a light-emitting diode package attached to the PCB via a solder joint; and
a liquid metal alloy comprising gallium, wherein the liquid metal alloy is configured to fill a crack formed in the solder joint, and then subsequently solidify, wherein the liquid metal alloy is separated from a material of the solder joint by a barrier material that prevents the liquid metal alloy from contacting the material of the solder joint until the crack is formed.

17. The light-emitting diode device of claim 16, wherein the liquid metal alloy solidifies in response to the gallium in the liquid metal alloy diffusing into the material of the solder joint resulting in a reduced melting point of the liquid metal alloy.

18. The light-emitting diode device of claim 16, wherein the liquid metal alloy is encapsulated by the barrier material in pockets spread through the material of the solder joint.

19. The light-emitting diode device of claim 16, wherein the liquid metal alloy is in a reservoir adjacent to the solder joint.

\* \* \* \* \*